United States Patent
Ogura (10) Patent No.: US 7,534,665 B2
(45) Date of Patent: May 19, 2009

(54) METHOD OF MANUFACTURING SEMICONDUCTOR DEVICE

(75) Inventor: Takashi Ogura, Gunma (JP)

(73) Assignee: Sanyo Electric Co., Ltd., Osaka (JP)

(*) Notice: Subject to any disclaimer, the term of this patent is extended or adjusted under 35 U.S.C. 154(b) by 491 days.

(21) Appl. No.: 11/233,637

(22) Filed: Sep. 23, 2005

(65) Prior Publication Data

US 2006/0068552 A1  Mar. 30, 2006

(30) Foreign Application Priority Data

Sep. 29, 2004 (JP) ............................ P2004-285023

(51) Int. Cl.
*H01L 21/8232* (2006.01)
*H01L 21/8234* (2006.01)

(52) U.S. Cl. .................... 438/135; 438/197; 438/279; 438/299

(58) Field of Classification Search ................ 438/279, 438/197, 135, 299, 301
See application file for complete search history.

(56) References Cited

U.S. PATENT DOCUMENTS

| 5,650,658 | A | 7/1997 | Beasom |
| 6,194,760 | B1* | 2/2001 | Lee .............................. 257/328 |
| 6,531,355 | B2* | 3/2003 | Mosher et al. ............... 438/227 |
| 2004/0238913 | A1* | 12/2004 | Kwon et al. ................. 257/492 |

FOREIGN PATENT DOCUMENTS

JP     2003-309258     10/2003

* cited by examiner

*Primary Examiner*—Michael Trinh
(74) *Attorney, Agent, or Firm*—Fish & Richardson P.C.

(57) ABSTRACT

In a semiconductor device manufacturing method of the present invention, a polysilicon film and a silicon nitride film are deposited on an upper surface of an epitaxial layer. Patterning is performed so that the polysilicon film and the silicon nitride film are left in regions in which a LOCOS oxide film is to be formed. Then, using steps of the polysilicon film and the silicon nitride film as alignment marks, a diffusion layer as drain regions is formed. Subsequently, the LOCOS oxide film is formed. This manufacturing method enables the diffusion layer to be formed with high position accuracy without being affected by a shape of the LOCOS oxide film.

4 Claims, 5 Drawing Sheets

METHOD OF MANUFACTURING SEMICONDUCTOR DEVICE

Priority is claimed to Japanese Patent Application Number JP2004-285023 filed on Sep. 29, 2004, the disclosure of which is incorporated herein by reference in its entirety.

BACKGROUND OF THE INVENTION

1. Field of the Invention

The present invention relates to a technology for forming a drain region with high accuracy in order to realize an improvement of breakdown voltage and a reduction of on-resistance.

2. Description of the Related Art

In a known method of manufacturing a semiconductor device, first, a LOCOS (local oxidation of silicon) oxide film is formed in drain regions which are formed so as to have double-diffused structures. At this time, bird's beak shapes of the LOCOS oxide film which are located on the drain region sides are formed so as to have gradual slopes and large sizes. Further, ions of an impurity are implanted through the upper surface of the LOCOS oxide film at a high acceleration voltage by utilizing the bird's beak shapes of the LOCOS oxide film, and then diffused. By this manufacturing method, a low-concentration diffusion layer is formed which is deeply diffused in the drain regions. Subsequently, using the LOCOS oxide film, an impurity is implanted through the surface of the low-concentration diffusion layer by a self-alignment technique to form a high-concentration diffusion layer in the drain regions. This technology is described for instance in pp. 8-10, FIGS. 5-9 in Japanese Patent Application Publication No. 2003-309258.

As described above, in the known semiconductor device manufacturing method, a silicon oxide film and a silicon nitride film are selectively formed on the surface of an epitaxial layer in the region in which the LOCOS oxide film is to be formed. Then, after the LOCOS oxide film is formed, the drain regions are formed by ion implantation through the upper surfaces of the bird's beaks of the LOCOS oxide film. Accordingly, there is the problem that alignment accuracy is low because the regions for forming the drain regions are deviated because of mask misalignment in the formation of the LOCOS oxide film, the film thicknesses, shapes, and the like of the bird's beak portions.

Further, if the drain regions are formed to the vicinity of a back-gate region which is formed to overlap a source region, there occurs the problem that the breakdown voltage deteriorates. On the other hand, if the drain regions are formed far from the back-gate region, there occurs the problem that the on-resistance increases. That is, the drain regions need to be formed with high accuracy in consideration of the breakdown voltage, the on-resistance, and the like. However, as described above, there is the problem that it is difficult to realize a desired breakdown voltage and a desired on-resistance because alignment accuracy for the drain regions is low.

Moreover, on the surface of the epitaxial layer, the silicon oxide film and the silicon nitride film for forming the LOCOS oxide film are deposited first. After the LOCOS oxide film is formed, the silicon oxide film and the silicon nitride film are removed, and a gate oxide film and a polysilicon film for gate electrodes are deposited. This manufacturing method has the problem that manufacturing cost is high because a manufacturing process is complicated.

SUMMARY OF THE INVENTION

The present invention provides a method of manufacturing a semiconductor device that includes the steps of forming an insulating layer on a surface of a semiconductor layer, and selectively removing the insulating layer so that an opening portion is provided over the semiconductor layer in a region in which a field oxide film is to be formed; depositing resist over the surface of the semiconductor layer, then selectively removing the resist using steps of the insulating layer as alignment marks, and forming a drain diffusion layer using the resist as a mask; forming the field oxide film from the surface of the semiconductor layer using the insulating layer, removing part of the insulating layer, and then forming gate electrodes so that at least one ends of the gate electrodes are placed over the field oxide film; and forming a back-gate diffusion layer so that part of the back-gate diffusion layer is placed under other ends of the gate electrodes, and forming a source diffusion layer from a surface of the back-gate diffusion layer. Thus, in the present invention, before the field oxide film is formed, the drain diffusion layer is formed using as alignment marks the insulating layer for forming the field oxide film. This manufacturing method enables the drain diffusion layer to be formed with high position accuracy.

Further, the semiconductor device manufacturing method of the present invention has a feature in which in the step of forming the back-gate diffusion layer, the back-gate diffusion layer is formed by a self-alignment technique using the other ends of the gate electrodes. Thus, in the present invention, the back-gate diffusion layer is formed by the self-alignment technique using the gate electrodes. This manufacturing method makes it possible to place the drain diffusion layer and the back-gate diffusion layer with high position accuracy and to realize a desired breakdown voltage and a desired on-resistance.

Further, the semiconductor device manufacturing method of the present invention has a feature in which in the step of selectively removing the insulating layer, a gate oxide film, a first silicon film, and a silicon nitride film are sequentially deposited over the surface of the semiconductor layer, and then the first silicon film and the silicon nitride film are removed to match the region in which the field oxide film is to be formed. Thus, in the present invention, the gate oxide film and the first silicon film used as the gate electrodes are used as the mask for forming the field oxide film. This manufacturing method makes it possible to simplify a manufacturing process and to reduce manufacturing cost.

Further, the semiconductor device manufacturing method of the present invention has a feature in which in the step of removing part of the insulating layer, the silicon nitride film is removed after the field oxide film has been formed. Thus, in the present invention, the gate oxide film covered with the silicon film is used as the insulating layer for forming the field oxide film. With this manufacturing method, the gate oxide film can be prevented from excessively growing by making the thickness of the gate oxide film equal to the desired film thickness when the gate oxide film is deposited on the surface of the semiconductor layer.

Further, the semiconductor device manufacturing method of the present invention has a feature in which in the step of forming the gate electrodes, a second silicon film is deposited over the surface of the semiconductor layer after the silicon nitride film has been removed, and steps of the field oxide film are used as alignment marks. Thus, in the present invention, the gate electrodes can be formed with high position accuracy in relation to the drain diffusion layer. Accordingly, the back-gate diffusion layer formed by the self-alignment technique using the gate electrodes can be formed with high position accuracy in relation to the drain diffusion layer.

DESCRIPTION OF THE PREFERRED EMBODIMENT

Hereinafter, a semiconductor device manufacturing method, which is one embodiment of the present invention, will be described in detail with reference to FIGS. 1 to 7.

FIGS. 1 to 7 are cross-sectional views for explaining the semiconductor device manufacturing method in this embodiment. In the explanation below, a description will be given of the case where, for example, n-channel MOS transistors are formed in one element formation region. However, the embodiment of the present invention is not limited to this case. For example, the embodiment of the present invention also covers the case where a semiconductor integrated circuit device is formed by forming p-channel MOS transistors, NPN transistors, vertical PNP transistors, and the like are formed in other element formation regions.

Figure 1:
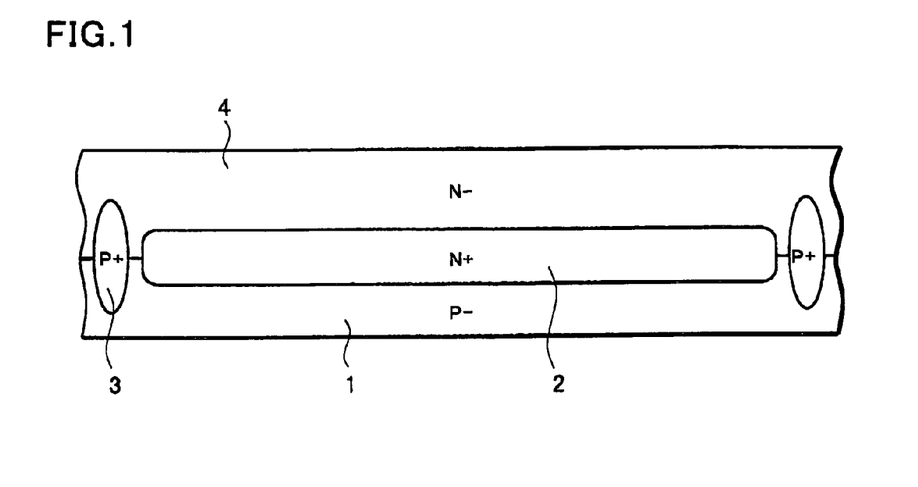
FIG. 1 is a cross-sectional view for explaining a semiconductor device manufacturing method in an embodiment of the present invention.

First, as illustrated in FIG. 1, a p-type single crystal silicon substrate 1 is prepared. Using a known photolithography technique, ions of an n-type impurity, e.g., phosphorus (P), are implanted through a surface of the substrate 1 to form an n-type buried diffusion layer 2. Next, using a photolithography technique, ions of a p-type impurity, e.g., boron (B), are implanted through the surface of the substrate 1 to form a p-type buried diffusion layer 3. The substrate 1 is then placed on a susceptor of an epitaxial growth system. Further, the substrate 1 is heated to a high temperature of, for example, approximately 1200° C. by lamp heating, and $SiHCl_3$ gas and $H_2$ gas are introduced into a reaction tube. By this step, an epitaxial layer 4 having, for example, a resistivity of 0.1 to 2.0 Ω·cm and a thickness of approximately 0.5 to 1.5 μm is grown on the substrate 1.

It should be noted that the substrate 1 and the epitaxial layer 4 in this embodiment correspond to a "semiconductor layer" in the present invention. Further, the case where one epitaxial layer 4 is formed on the substrate 1 is described in this embodiment. However, the embodiment of the present invention is not limited to this. For example, the "semiconductor layer" of the embodiment of the present invention may be a substrate alone or may be a substrate with a plurality of epitaxial layers deposited on an upper surface thereof. Further, the substrate may be an n-type single crystal silicon substrate or a compound semiconductor substrate.

Figure 2:
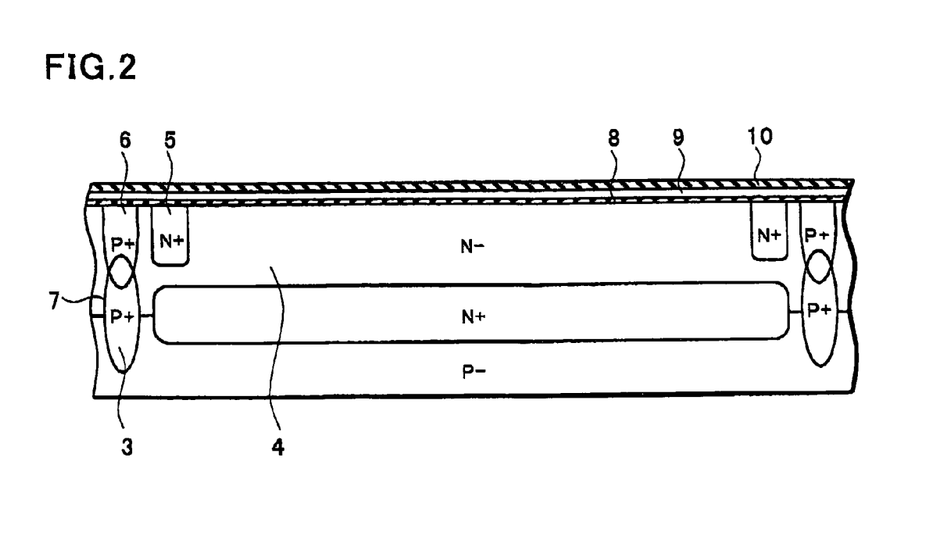
FIG. 2 is a cross-sectional view for explaining the semiconductor device manufacturing method in the embodiment of the present invention.

Next, as illustrated in FIG. 2, using a known photolithography technique, ions of an n-type impurity, e.g., phosphorus (P), are implanted through the surface of the epitaxial layer 4 to form an n-type diffusion layer 5. Subsequently, using a known photolithography technique, ions of a p-type impurity, e.g., boron (B), are implanted through the surface of the epitaxial layer 4 to form a p-type diffusion layer 6. The p-type buried diffusion layer 3 and the p-type diffusion layer 6 are coupled to form an isolation region 7. As described above, the substrate 1 and the epitaxial layer 4 are sectioned into a plurality of island-shaped regions by the isolation region 7. Subsequently, a silicon oxide film 8, a polysilicon film 9, and a silicon nitride film 10 are sequentially deposited on the surface of the epitaxial layer 4.

It should be noted that the silicon oxide film 8, the polysilicon film 9, and the silicon nitride film 10 in this embodiment correspond to an "insulating layer" in the present invention. Further, the polysilicon film 10 in this embodiment corresponds to a "first silicon film" in the present invention.

Figure 3:
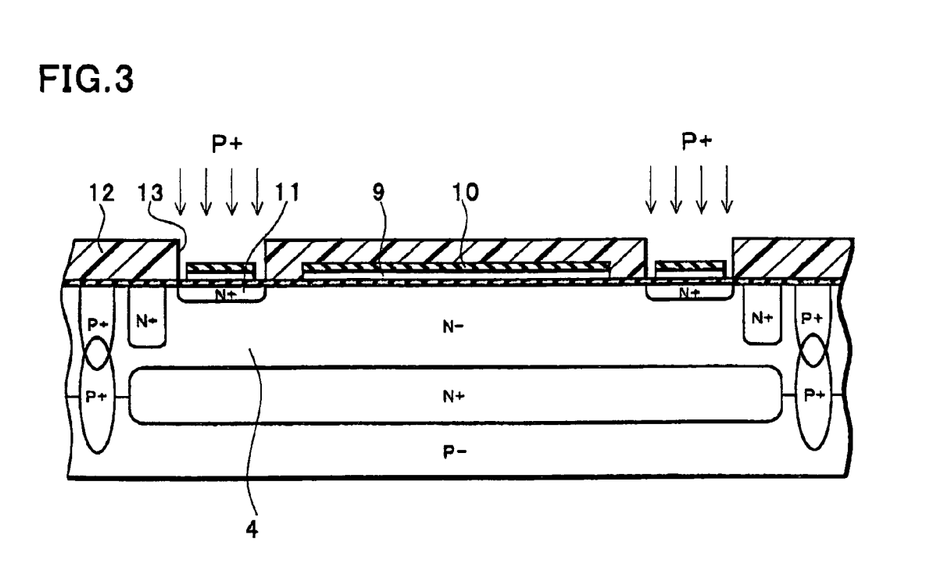
FIG. 3 is a cross-sectional view for explaining the semiconductor device manufacturing method in the embodiment of the present invention.

Next, as illustrated in FIG. 3, the polysilicon film 9 and the silicon nitride film 10 are selectively removed so that an opening portion is provided in a portion in which a LOCOS oxide film 14 (see FIG. 4) is to be formed. Actually, though not illustrated in this drawing, steps are formed on the surface of the substrate 1 in a scribe line region when the n-type buried diffusion layer 2 is formed. Using these steps as alignment marks, the polysilicon film 9 and the silicon nitride film 10 are selectively removed. Subsequently, a photoresist 12 for forming an n-type diffusion layer 11 to be used as drain regions is deposited over the surface of the epitaxial layer 4. Then, using a known photolithography technique, opening portions 13 are formed in regions in which the n-type diffusion layer 11 is formed.

As described above, patterns of the polysilicon film 9 and the silicon nitride film 10 are arranged so as to match the region in which the LOCOS oxide film 14 is to be formed. Further, the opening portions 13 are formed by utilizing steps of the polysilicon film 9 and the silicon nitride film 10 which are placed as alignment marks in the scribe line region. Subsequently, using the photoresist 12 as a mask, ions of an n-type impurity, e.g., phosphorus (P), are implanted to form the n-type diffusion layer 11.

This manufacturing method makes it possible to form the n-type diffusion layer 11 by ion implantation before the formation of the LOCOS oxide film 14. That is, the n-type diffusion layer 11 can be formed without performing ion implantation through the upper surfaces of bird's beaks of the LOCOS oxide film 14, and therefore does not depend on the thicknesses, shapes, and the like of the bird's beaks of the LOCOS oxide film. As a result, the n-type diffusion layer 11 can be formed in desired regions with high position accuracy.

It should be noted that the n-type diffusion layer 11 in this embodiment corresponds to a "drain diffusion layer" in the present invention. Further, the LOCOS oxide film 14 in this embodiment corresponds to a "field oxide film" in the present invention. However, the "field oxide film" is not limited to one formed by LOCOS method. The "field oxide film" of the embodiment of the present invention may be one formed by a manufacturing method by which a thick thermal oxide film can be formed.

Figure 4:
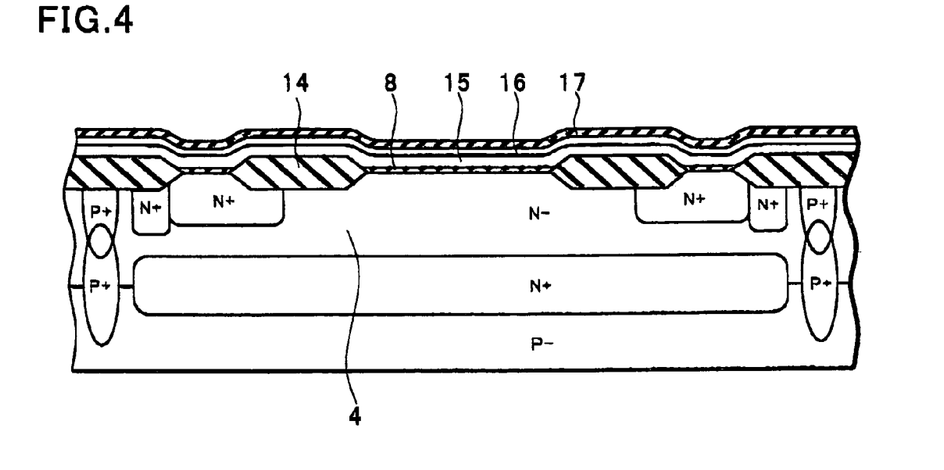
FIG. 4 is a cross-sectional view for explaining the semiconductor device manufacturing method in the embodiment of the present invention.

Next, as illustrated in FIG. 4, using the polysilicon film 9 and the silicon nitride film 10 as a mask, oxide film is deposited on the silicon oxide film 8 by steam oxidation, for example, at approximately 800 to 1200° C. At the same time, the entire substrate 1 is subjected to heat treatment to form the LOCOS oxide film 14. At this time, bird's beaks are formed in portions of regions in which the polysilicon film 9 and the silicon nitride film 10 are formed. It should be noted that the thicknesses of flat portions of the LOCOS oxide film 14 become, for example, approximately 3000 to 5000 angstroms. In particular, on the isolation region 7, isolation is further achieved by forming the LOCOS oxide film 14. Subsequently, the silicon nitride film 10 left between portions of the LOCOS oxide film 14 is removed.

Next, a polysilicon film 15, a tungsten silicide film 16, and a silicon oxide film 17 are sequentially deposited over the upper surface of the epitaxial layer 4 so as to cover the upper surfaces of the residual silicon oxide film 8 and the residual polysilicon film 9. At this time, the silicon oxide film 8 left on the surface of the epitaxial layer 4 is used as a gate oxide film. Further, desired film thicknesses suitable for use as gate electrodes are obtained by depositing the polysilicon film 15 and the tungsten silicide film 16 on the upper surface of the residual polysilicon film 9. It should be noted that the polysilicon film 9 and the polysilicon film 15 are integrally illustrated in FIG. 4.

That is, in this embodiment, the silicon oxide film 8 used as the gate oxide film and the polysilicon film 9 used as the gate electrodes are also used as a mask for forming the LOCOS oxide film 14. This manufacturing method makes it possible to omit the steps of depositing and removing a silicon oxide film used to form the LOCOS oxide film 14, and to reduce manufacturing cost by simplifying a manufacturing process.

Moreover, the silicon oxide film 8 can be protected with the polysilicon film 9 by depositing the polysilicon film 9 on the upper surface of the silicon oxide film 8 after the formation of the silicon oxide film 8. Further, the thickness of the silicon oxide film 8 is maintained in a range suitable for use as a gate oxide film.

It should be noted that the polysilicon film 15 and the tungsten silicide film 16 in this embodiment correspond to a "second silicon film" in the present invention. However, the "second silicon film" may be the polysilicon film 15 alone or the tungsten silicide film 16 alone. Other than these, the "second silicon film" may be any film as long as the gate electrodes can be formed.

Figure 5:
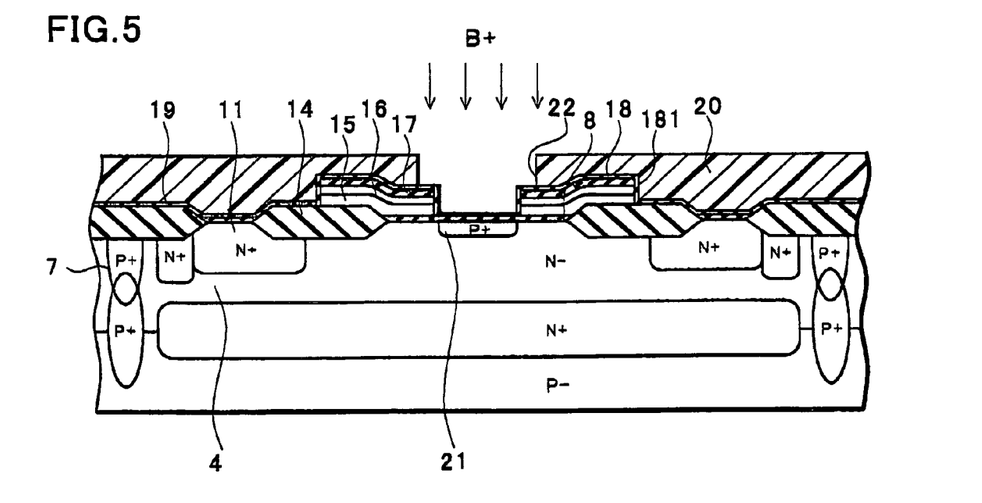
FIG. 5 is a cross-sectional view for explaining the semiconductor device manufacturing method in the embodiment of the present invention.

Next, as illustrated in FIG. 5, the polysilicon film 15, the tungsten silicide film 16, and the silicon oxide film 17 are selectively removed so that the polysilicon film 15, the tungsten silicide film 16, and the silicon oxide film 17 are left in regions used as gate electrodes 18. At this time, one ends 181 of the gate electrodes 18 are placed on the upper surface of the LOCOS oxide film 14.

Subsequently, a TEOS film 19 is deposited over the upper surface of the epitaxial layer 4, and a photoresist 20 is deposited on the upper surface of the TEOS film 19. Using a known photolithography technique, an opening portion 22 is formed in the photoresist 20 in a region in which a p-type diffusion layer 21 used as a back-gate region is to be formed. Then, using the photoresist 20 as a mask, ions of a p-type impurity, e.g., boron (B), are implanted to form the p-type diffusion layer 21. At this time, as illustrated in the drawing, using the other ends 182 of the gate electrodes 18, the p-type diffusion layer 21 is formed by a self-alignment technique.

As described above, the n-type diffusion layer 11 is formed before the formation of the LOCOS oxide film 14 by utilizing the steps of the polysilicon film 9 and the silicon nitride film 10 which are used to form the LOCOS oxide film 14. The gate electrodes 18 are formed by utilizing steps of the LOCOS oxide film which have been formed as alignment marks. Further, the p-type diffusion layer 21 is formed by a self-alignment technique using the other ends 182 of the gate electrodes 18. This manufacturing method enables the p-type diffusion layer 21 to be formed with high position accuracy in relation to the n-type diffusion layer 11 used as drain regions.

It should be noted that the p-type diffusion layer 21 in this embodiment corresponds to a "back-gate diffusion layer" in the present invention.

Figure 6:
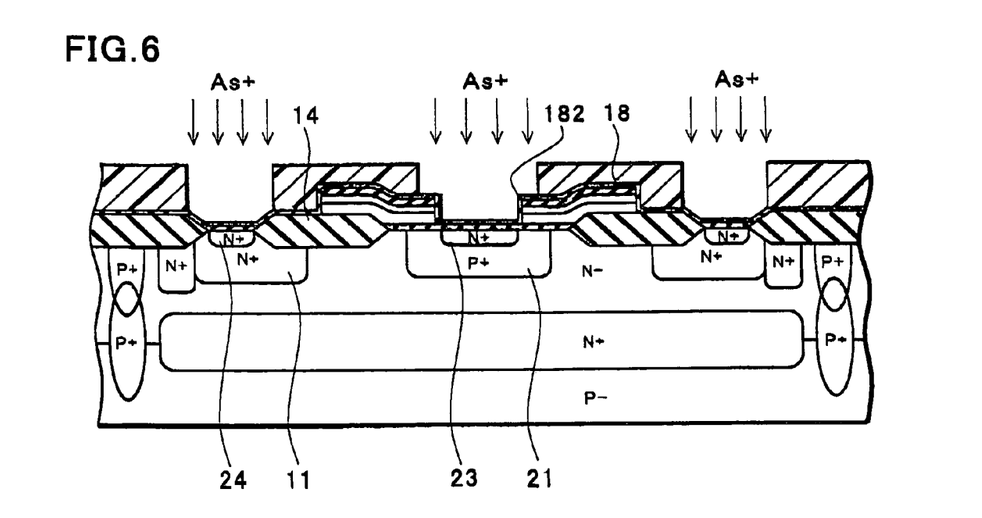
FIG. 6 is a cross-sectional view for explaining the semiconductor device manufacturing method in the embodiment of the present invention.

Next, as illustrated in FIG. 6, using a known photolithography technique, ions of an n-type impurity, e.g., phosphorus (P), are implanted through the surface of the epitaxial layer 4 to form n-type diffusion layers 23 and 24. The n-type diffusion layer 23 is used as a source region, and the n-type diffusion layer 24 is used as drain extraction regions. As illustrated in this drawing, the n-type diffusion layers 23 and 24 are formed by a self-alignment technique using the LOCOS oxide film 14.

Figure 7:
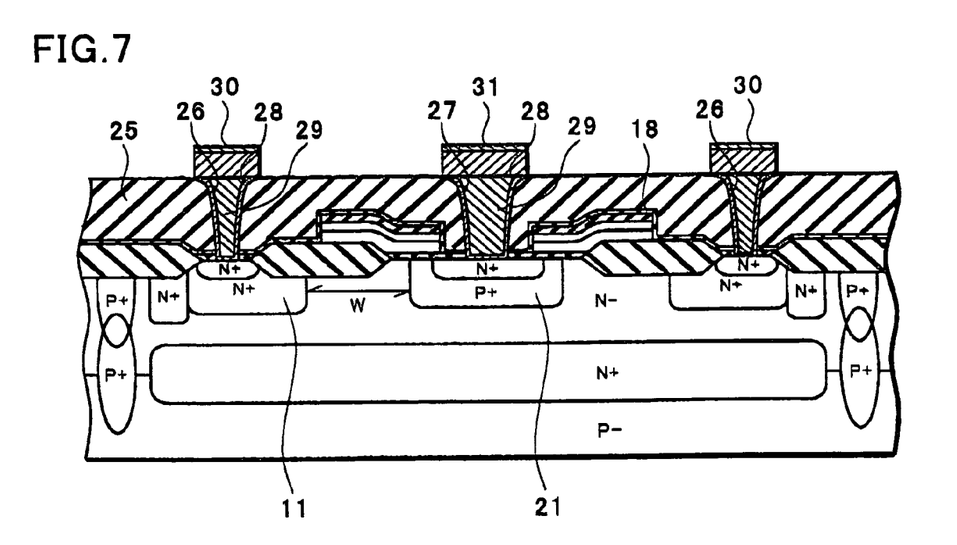
FIG. 7 is a cross-sectional view for explaining the semiconductor device manufacturing method in the embodiment of the present invention.

Finally, as illustrated in FIG. 7, for example, a BPSG (Boron Phospho Silicate Glass) film, an SOG (Spin On Glass) film, or the like is deposited as an insulating layer 25 over the entire surface of the epitaxial layer 4. Further, using a known photolithography technique, contact holes 26 and 27 are formed in the insulating layer 25 by, for example, dry etching using a $CHF_3+O_2$-based gas.

Next, a barrier metal film 28 is formed on the inner walls of the contact holes 26 and 27, and the like. The insides of the contact holes 26 and 27 are filled with a tungsten (W) film 29. Further, an aluminum copper (AlCu) film and a barrier metal film are deposited on the upper surface of the tungsten film 29 by CVD method. Then, using a known photolithography technique, the aluminum copper film and the barrier metal film are selectively removed to form drain electrodes 30 and a source electrode 31. It should be noted that a wiring layer connected to the gate electrodes are not illustrated in the cross section illustrated in FIG. 7 but the gate electrodes are connected to a wiring layer in other region.

Figure 8A:
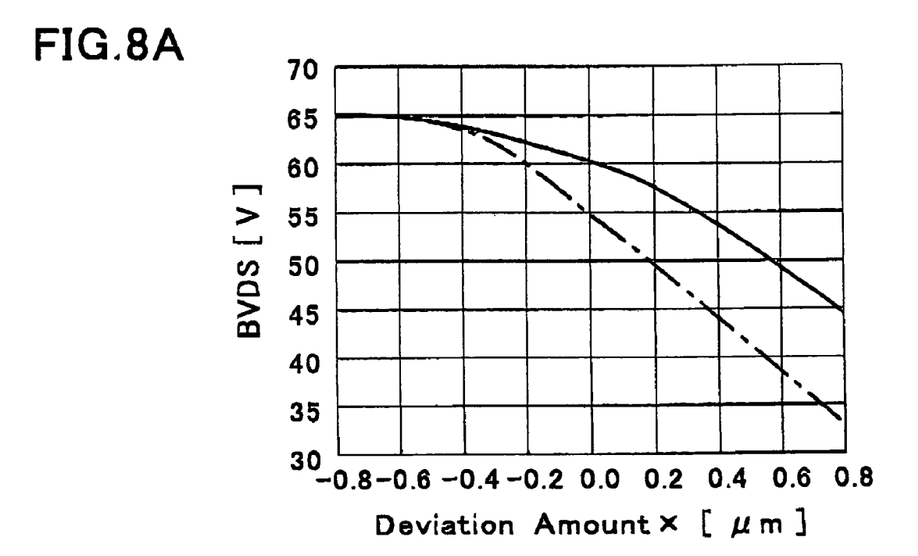
FIG. 8A is a view for explaining a breakdown voltage of the semiconductor device in the embodiment of the present invention.
Figure 8B:
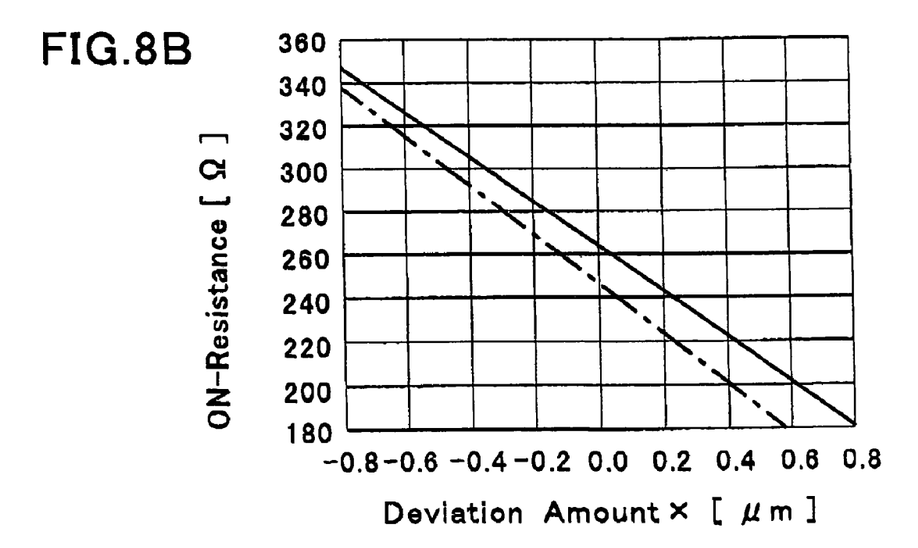
FIG. 8B is a view for explaining an on-resistance of the semiconductor device.

Next, using FIGS. 7, 8A and 8B, a description will be given of the breakdown voltage and on-resistance of the n-channel MOS transistor formed by the above-described manufacturing method. FIG. 8A is a view illustrating the relationship to the breakdown voltage between the drain and source and the deviation amount of the distance between the drain and back-gate regions. FIG. 8B is a view illustrating the relationship between the on-resistance and the deviation amount of the distance between the drain and back-gate regions.

As illustrated in FIG. 7, the breakdown voltage and on-resistance of the n-channel MOS transistor primarily depend on the distance W between the n-type diffusion layer 11 as the drain region and the p-type diffusion layer 21 as the back-gate region. For example, in the case where the diffusion layers 11 and 21 are placed so that the distance W becomes small, the on-resistance decreases but the breakdown voltage deteriorates. On the other hand, in the case where the diffusion layers 11 and 21 are placed so that the distance W becomes large, the breakdown voltage improves but the on-resistance increases. That is, there is a trade-off between the breakdown voltage and on-resistance of the n-channel MOS transistor. A desired distance W is determined in consideration of both characteristics.

First, in FIG. 8A, the vertical axis is the breakdown voltage between the drain and source, and the horizontal axis is the deviation amount X (μm) of the distance W between the n-type diffusion layer 11 and the p-type diffusion layer 21. Further, in the horizontal axis, a desired distance W is 0.0. Positive values indicate cases where the distance W is smaller, and negative values indicate cases where the distance W is larger. Moreover, a full line indicates the case where the amount of an impurity introduced into the n-type diffusion layer 11 is $2.0 \times 10^{12}$ (/cm$^2$). A dashed-dotted line indicates the case where the amount of an impurity introduced into the n-type diffusion layer 11 is $5.0 \times 10^{12}$ (/cm$^2$).

As indicated by the full line, in the case where the amount of the introduced impurity is $2.0 \times 10^{12}$ (/cm$^2$), the breakdown voltage between the drain and source shows characteristic values in a range of 60 to 65 (V) by setting the deviation amount X (μm) of the distance W in a range of, for example, $-0.8 < X < 0.1$. On the other hand, as indicated by the dashed-dotted line, in the case where the amount of the introduced impurity is $5.0 \times 10^{12}$ (/cm$^2$), the breakdown voltage between the drain and source shows characteristic values in a range of 53 to 60 (V) by setting the deviation amount X (μm) of the distance W in a range of, for example, $-0.2 < X < 0.1$. That is, from a comparison between the full line and the dashed-dotted line, it can be seen that a depletion layer formation region is narrowed and the breakdown voltage deteriorates with an increasing amount of the impurity introduced when the n-type diffusion layer 11 is formed. Further, if consideration is given only to the breakdown voltage when the n-type diffusion layer 11 is formed, the breakdown voltage is improved as the distance W is widened.

Next, in FIG. 8B, the vertical axis is the on-resistance, and the horizontal axis is the deviation amount X (μm) of the distance W between the n-type diffusion layer 11 and the p-type diffusion layer 21. Further, in the horizontal axis, a desired distance W is 0.0. Positive values indicate cases where the distance W is smaller, and negative values indicate cases where the distance W is larger. Moreover, a full line indicates the case where the amount of an impurity introduced into the n-type diffusion layer 11 is $2.0 \times 10^{12}$ (/cm$^2$). A dashed-dotted line indicates the case where the amount of an impurity introduced into the n-type diffusion layer 11 is $5.0 \times 10^{12}$ (/cm$^2$).

As indicated by the full line and the dashed-dotted line, it can be seen that the resistance in the drain region decreases and the on-resistance also decreases with an increasing amount of the impurity introduced when the n-type diffusion layer 11 is formed. Further, if consideration is given only to the on-resistance when the n-type diffusion layer 11 is formed, the on-resistance decreases as the distance W is narrowed.

As described above using FIGS. 7, 8A and 8B in consideration of both of the breakdown voltage and the on-resistance, in the case where the amount of the introduced impurity is $2.0 \times 10^{12}$ (/cm$^2$), setting the deviation amount X of the distance W in a range of $-0.2 < X < 0.1$ makes it possible to prevent an increase of the on-resistance while the desired breakdown voltage is maintained. On the other hand, in the case where the amount of the introduced impurity is $5.0 \times 10^{12}$ (/cm$^2$), setting the deviation amount X of the distance W in a range of $-0.2 < X < 0.1$ makes it possible to prevent an increase of the on-resistance while the desired breakdown voltage is maintained. That is, the n-type diffusion layer 11 and the p-type diffusion layer 21 are preferably formed so that the deviation amount X of the distance W is in a range of $-0.2 < X < 0.1$. This can be realized by the aforementioned semiconductor device manufacturing method.

It should be noted that, in this embodiment, the deviation amount X of the distance W is not limited to a range of $-0.2 < X < 0.1$. For example, in the case where the breakdown voltage is more desired than the on-resistance, it is also possible to intentionally set the deviation amount X of the distance W to a negative value. In contrast, in the case where the on-resistance is more desired, it is also possible to intentionally set the deviation amount X of the distance W to a positive value. Other than these, various modifications can be made without departing from the scope of the embodiment of the present invention.

In the embodiment of the present invention, the drain diffusion layer is formed by utilizing, as alignment marks, steps of the insulating layer used as a mask for forming the field oxide film. Here, the drain diffusion layer can be formed in a step before the step of forming the field oxide film. This manufacturing method enables the drain diffusion layer to be formed with high position accuracy without being affected by the shape and the like of the field oxide film.

Further, in the embodiment of the present invention, the gate electrodes are patterned by utilizing steps of the field oxide film. Then, the back-gate diffusion layer is formed by a self-alignment technique using the other ends of the gate electrodes. This manufacturing method makes it possible to place the drain diffusion layer and the back-gate diffusion layer with high position accuracy and to realize a desired breakdown voltage and a desired on-resistance.

Moreover, in the embodiment of the present invention, the gate oxide film and the silicon film used as the gate electrodes are used as an insulating layer for forming the field oxide film. Subsequently, the gate electrodes are formed using the gate oxide film and the silicon film. This manufacturing method makes it possible to simplify a manufacturing process and to reduce manufacturing cost.

Furthermore, in the embodiment of the present invention, after the gate oxide film has been deposited on the surface of the semiconductor layer, the gate oxide film is covered with the silicon film used as the gate electrodes. Then, on the upper surface of the silicon film, a silicon film is further deposited so that the gate electrodes have desired film thicknesses. This manufacturing method makes it possible to prevent the gate oxide film from excessively growing and to maintain the thickness of the gate oxide film at a desired thickness.

What is claimed is:

1. A method of manufacturing a semiconductor device, comprising the steps of:
    depositing sequentially a gate oxide film, a first silicon film, and a silicon nitride film on a surface of a semiconductor layer, and selectively removing the first silicon and the silicon nitride film so that an opening portion is provided over the semiconductor layer in a region in which a field oxide film is to be formed;
    depositing resist over the surface of the semiconductor layer, then selectively removing the resist using steps of the opening portion as alignment marks, and forming a drain diffusion layer using the resist as a mask;
    forming the field oxide film at the surface of the semiconductor layer using the silicon nitride film, removing at least the silicon nitride film, and then forming gate electrodes so that at least one ends of the gate electrodes are placed over the field oxide film; and forming a back-gate diffusion layer so that part of the back-gate diffusion layer is placed under other ends of the gate electrodes, and forming a source diffusion layer from a surface of the back-gate diffusion layer.

2. The method according to claim 1, wherein in the step of forming the gate electrodes, a second silicon film is deposited over the surface of the semiconductor layer using steps of the field oxide film as alignment marks.

3. The method according to claim 1, wherein in the step of forming the back-gate diffusion layer, the back-gate diffusion layer is formed by a self-alignment technique using the other ends of the gate electrodes.

4. The method according to claim 2, wherein the first silicon film and the second silicon film are polysilicon films.

* * * * *